United States Patent
Cheng et al.

(10) Patent No.: US 8,116,145 B2
(45) Date of Patent: Feb. 14, 2012

(54) METHOD AND APPARATUS FOR PROGRAMMING AUTO SHUT-OFF

(75) Inventors: Pearl P. Cheng, Los Altos, CA (US); Harry S. Luan, Saratoga, CA (US); Chinh Vo, San Jose, CA (US); Chih-Chieh (Steve) Wang, Fremont, CA (US)

(73) Assignee: Kilopass Technology, Inc., Santa Clara, CA (US)

( * ) Notice: Subject to any disclaimer, the term of this patent is extended or adjusted under 35 U.S.C. 154(b) by 10 days.

(21) Appl. No.: 12/202,048

(22) Filed: Aug. 29, 2008

(65) Prior Publication Data

US 2010/0054048 A1    Mar. 4, 2010

(51) Int. Cl.
    *G11C 7/00* (2006.01)
(52) U.S. Cl. ............... 365/189.07; 365/185.18
(58) Field of Classification Search .......... None
    See application file for complete search history.

(56) References Cited

U.S. PATENT DOCUMENTS

| | | | |
|---|---|---|---|
| 6,222,771 B1 * | 4/2001 | Tang et al. | 365/185.22 |
| 7,656,712 B2 * | 2/2010 | Lisi et al. | 365/185.2 |
| 2003/0156457 A1 * | 8/2003 | Ooishi | 365/185.21 |
| 2005/0018483 A1 * | 1/2005 | Imamiya et al. | 365/185.09 |

* cited by examiner

*Primary Examiner* — Hoai V Ho
*Assistant Examiner* — James G Norman
(74) *Attorney, Agent, or Firm* — Perkins Coie LLP (57) ABSTRACT

A method and system for enabling auto shut-off of programming of a non-volatile memory cell is disclosed. The system includes a memory array having a plurality of memory cells, each cell storing one bit of data. During the programming process, programming signals are applied to the target memory cells. A predefined period of time after the programming signals are applied, the auto shut-off system begins sensing an output signal from the memory cell. After the system detects an output signal from the memory cell, the system waits for a second predefined period of time before turning off the programming voltages. The system may be configured to sense an output voltage from the memory cell. The system then compares the output voltage to a reference voltage in order to detect when the cell is programmed. Alternatively, the system may sense an output current from the memory cell. The system then compares the output current to a reference current to detect when the cell is programmed.

20 Claims, 7 Drawing Sheets

METHOD AND APPARATUS FOR PROGRAMMING AUTO SHUT-OFF

BACKGROUND

Nonvolatile memory retains stored data when power is removed, which is required or at least highly desirable in many different types of computers and other electronic devices. One commonly available type of nonvolatile memory is the programmable read-only memory ("PROM"), which uses word line—bit line crosspoint elements such as fuses, anti-fuses, and trapped charge devices, such as the floating gate avalanche injection metal oxide semiconductor transistor to store logical information. PROM typically is not reprogrammable.

One example of a PROM cell that uses the breakdown of a silicon dioxide layer in a capacitor to store digital data is disclosed in U.S. Pat. No. 6,215,140, issued Apr. 10, 2001 to Reisinger et al. The basic PROM disclosed by Reisinger et al. uses a series combination of an oxide capacitor and a junction diode as the crosspoint element. An intact capacitor represents the logic value 0, and an electrically broken-down capacitor represents the logic value 1. The thickness of the silicon dioxide layer is adjusted to obtain the desired operation specifications. Silicon dioxide has a breakdown charge of about 10 C/cm$^2$ (Coulomb/cm$^2$). If a voltage of 10 volts is applied to a capacitor dielectric with a thickness of 10 nm (resultant field strength 10 mV/cm), a current of about 1 mA/cm$^2$ flows. With 10 volts, this results in a substantial amount of time for programming a memory cell. However, it is more advantageous to design the capacitor dielectric to be thinner, in order to reduce the high power loss that occurs during electrical breakdown. For example, a memory cell configuration having a capacitor dielectric with a thickness of 3 to 4 nm can be operated at about 1.5 V. The capacitor dielectric does not yet break down at this voltage, and thus 1.5 V is sufficient to read data from the memory cell. Data are stored, for example, at 5 V, in which case one cell strand in a memory cell configuration can be programmed within about 1 ms. The programming speed can be changed depending on permissible power losses.

Some types of nonvolatile memory are capable of being repeatedly programmed and erased, including erasable programmable read-only semiconductor memory, generally known as EPROM, and electrically erasable programmable read-only semiconductor memory, generally known as EEPROM. EPROM memory is erased by applying ultraviolet light and programmed by applying various voltages, while EEPROM memory is both erased and programmed by applying various voltages. EPROMs and EEPROMs have suitable structures, generally known as floating gates, that are charged or discharged in accordance with data to be stored thereon. The charge on the floating gate establishes the threshold voltage, or $V_T$, of the device, which is sensed when the memory is read to determine the data stored therein.

A device known as a metal nitride oxide silicon ("MNOS") device has a channel located in silicon between a source and drain and overlain by a gate structure that includes a silicon dioxide layer, a silicon nitride layer, and an aluminum layer. The MNOS device is capable of switching between two threshold voltage states $V_{TH(high)}$ and $V_{TH(low)}$ by applying suitable voltage pulses to the gate, which causes electrons to be trapped in the oxide-nitride gate ($V_{TH(high)}$) or driven out of the oxide-nitride gate ($V_{TH(low)}$).

A semiconductor memory cell that uses dielectric breakdown to store digital data is disclosed in U.S. Pat. No. 6,798,693, issued Sep. 28, 2004 and assigned to the assignee of the current application, which is hereby incorporated by reference. The memory cell has a data storage element constructed around an ultra-thin dielectric, such as a gate oxide. The memory cell stores information by stressing the ultra-thin dielectric into breakdown (soft or hard breakdown) to set the leakage current level of the memory cell. The memory cell is read by sensing the current drawn by the cell. The ultra-thin dielectric could include, for example, a high-quality gate oxide of about 50 Å thickness or less, as is commonly available from presently available advanced CMOS logic processes.

DETAILED DESCRIPTION

A method and system for enabling auto shut-off of programming of a non-volatile memory cell is disclosed (hereinafter "the auto shut-off system" or "the system"). The system includes a memory array having a plurality of memory cells, each cell storing one bit of data. A memory cell stores a zero value when unprogrammed and a one value when programmed. During the programming process, programming signals are applied to the target memory cells. A predefined period of time after the programming signals are applied, the auto shut-off system begins sensing an output signal from the memory cell. After the system detects an output signal from the memory cell, the system waits for a second predefined period of time before turning off the programming voltages. In one embodiment, the system is configured to sense an output voltage from the memory cell. The system then compares the output voltage to a reference voltage in order to detect when the cell is programmed. In another embodiment, the system senses an output current from the memory cell. The system then compares the output current to a reference current to detect when the cell is programmed.

Various embodiments of the invention will now be described. The following description provides specific details for a thorough understanding and an enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments. The terminology used in the description presented below is intended to be interpreted in its broadest reasonable manner, even though it is being used in conjunction with a detailed description of certain specific embodiments of the invention.

Non-volatile memory components generally store data by converting a memory element from an open circuit to a closed circuit. Thus, the data in a particular memory cell may be read by applying a control voltage or current to the cell and reading the resulting output signal. The programming process depends on the underlying technology of the memory cell. In general, the programming process must be executed according to specific programming times and voltages. For example, in many memory devices, the programming voltage must be applied for a time period that is neither too long nor too short. If the time period is too short, the cell is said to be "undercooked," meaning that the cell was not programmed long enough to retain the data value being programmed. Conversely, if the time period is too long, the component being programmed may, in effect, heal itself and return to an unprogrammed state. In this case, the cell is said to have been "overcooked" and remains in its unprogrammed state. These time periods may vary between memory cells because of variations in manufacturing. Thus, it would be useful to have a way to reduce the incidence of this type of error in programming.

Figure 1:
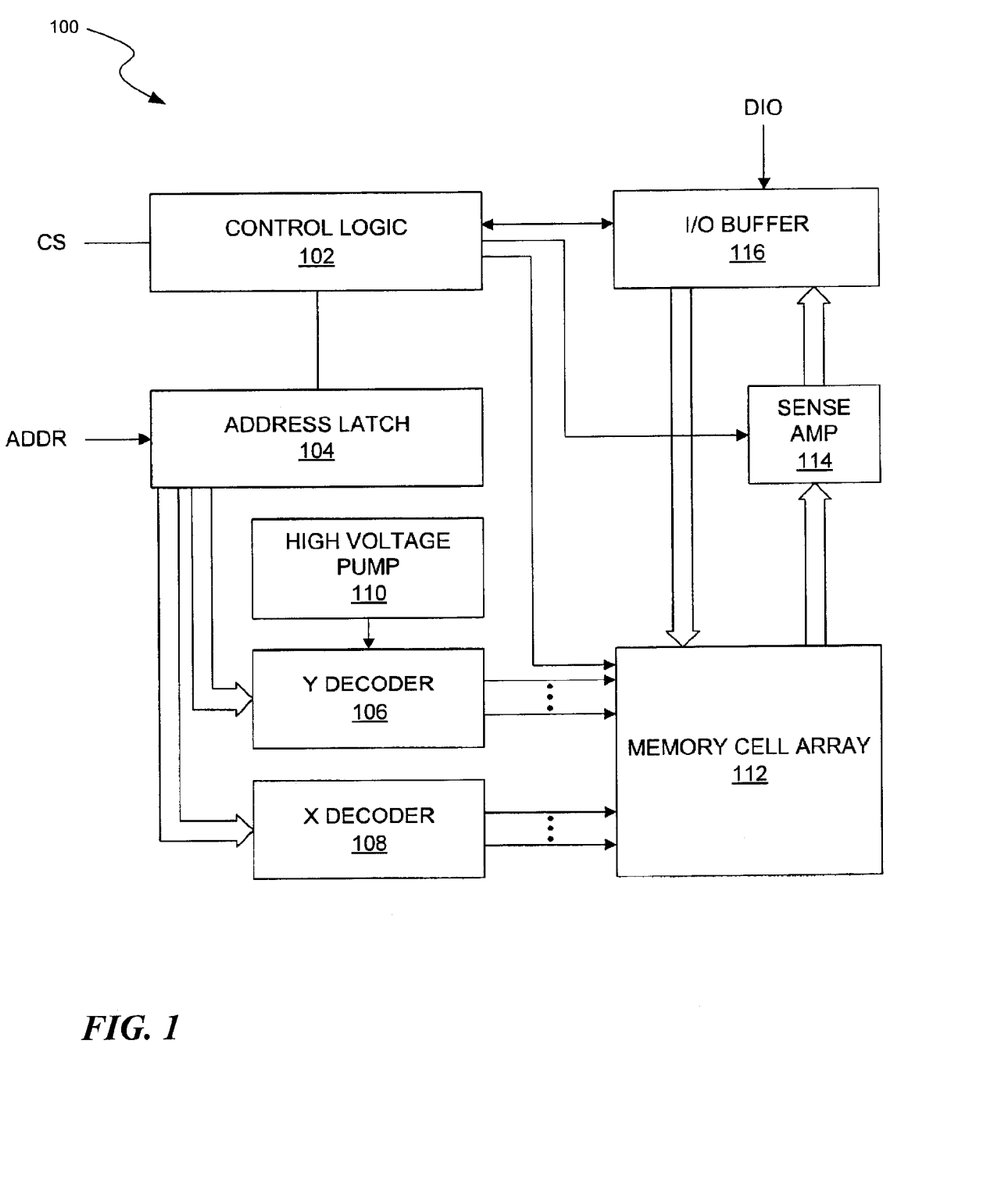
FIG. 1 illustrates a memory circuit suitable for implementing an auto shut-off system.

FIG. 1 illustrates a memory circuit 100 suitable for implementing the auto shut-off system. The memory circuit 100 includes a control logic component 102, an address latch 104, an I/O buffer 116, and a memory cell array 112. The memory cell array 112 includes a plurality of memory cells, each cell configured to store one bit of data. The control logic component 102 controls the functioning of the memory circuit 100 based on internal logic and a control signal CS, which provides control input from external components. The memory circuit 100 also includes an address latch 104, which stores the address of a memory cell to be accessed. The address latch 104 receives the selected address through an address signal ADDR. The address latch 104 provides portions of the received address to an X decoder 106 and a Y decoder 108. A high voltage pump 110 is also connected to the X decoder 106. The high-voltage pump 110 is useful for programming operations requiring a high voltage. The high voltage is provided to input lines as required by the programming process. Thus, in FIG. 1, the high voltage pump 110 is connected only to the X decoder 106 because the memory cell array 112 is configured such that cells can be programmed with a high voltage only on lines connected to the X decoder 106. Depending on the configuration of the memory cell array 112, the high-voltage pump 110 may be connected only to the Y decoder 108 or to both the X decoder 106 and the Y decoder 108.

The memory circuit 100 also contains an I/O buffer 116. The I/O buffer 116 buffers data during write operations before it is written to the memory cell array 112 and during read operations after it is received from the memory cell array 112. The memory circuit 100 also includes a sense amplifier 114 that determines the stored value of a memory cell based on the output signal generated in response to a read signal. The operation of the sense amplifier 114 is described below with reference to FIG. 2. It will be appreciated that the memory circuit 100 is only illustrative, as many other techniques for addressing a memory array, transferring data into and out of a memory array, supplying the various operating voltages required by the memory array, and so forth, may be used as desired.

Figure 2:
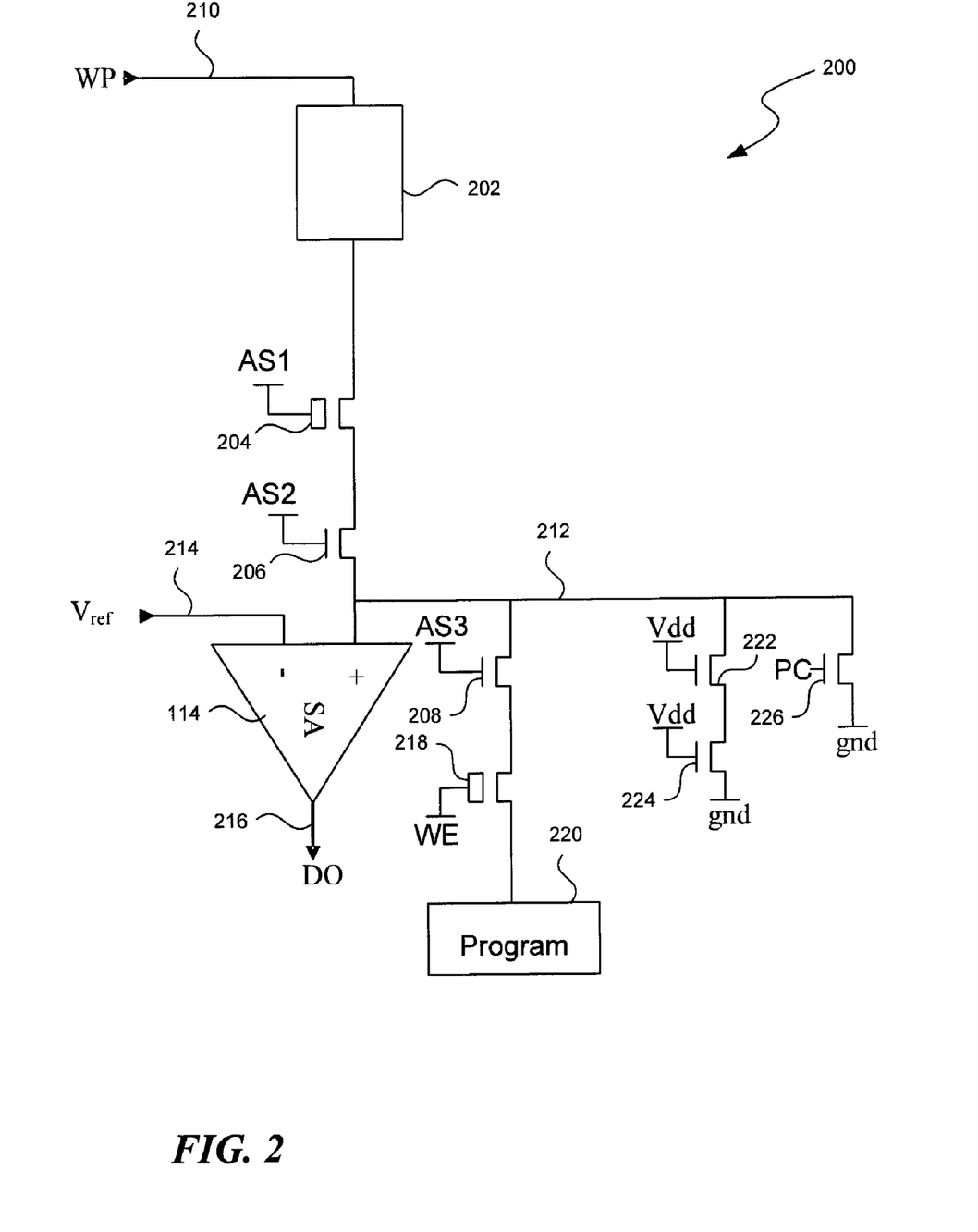
FIG. 2 illustrates a read circuit suitable for reading data from a programmable memory cell in the memory cell array.

FIG. 2 illustrates a read circuit 200 suitable for reading data from a memory cell in the memory cell array 112. The circuit 200 includes a programmable memory cell 202, which stores either a zero value or a one value. One skilled in the art will appreciate that the programmable memory cell 202 may have any number of configurations internally. For example, the programmable memory cell 202 may be an EPROM cell having a floating gate that is charged according to the data stored thereon. Alternatively, the programmable memory cell 202 may be a semiconductor memory cell configured to use dielectric breakdown to store data, as in U.S. Pat. No. 6,798,693. Regardless of the underlying technology, the programmable memory cell 202 generally operates as a capacitor when it is unprogrammed and as a resistor when it has been programmed. That is, the programmable memory cell 202 conducts a DC signal when programmed and acts as an open circuit in response to a DC signal when unprogrammed.

The circuit 200 includes address select lines AS1, AS2 and AS3, which are used to address individual memory cells in the memory cell array 112. In particular, address select line AS1 is connected to the gate of an address select transistor 204. In the embodiment shown in FIG. 2, the address select transistor 204 has a thicker gate oxide layer than is typical for transistors in the circuit 200. However, one skilled in the art will appreciate that this is a design choice that may vary depending on the underlying technology of the programmable memory cell 202. The address select transistor 204 may also be configured with a gate oxide of similar thickness to other transistors in the circuit. Similarly, address select lines AS2 and AS3 are connected to address select transistors 206 and 208, respectively. The programmable memory cell 202 also receives as an input a program wordline (WP) signal, which is provided through a WP signal line 210. The circuit 200 also includes the sense amplifier 114. The sense amplifier 114 is a comparator having a positive terminal connected to a bit line 212 and a negative terminal connected to an input line 214, which provides a reference voltage $V_{ref}$. The sense amplifier 114 generates a data output signal (DO) through an output line 216 by comparing the voltage on bit line 212 to $V_{ref}$. The circuit 200 also includes a program select transistor 218 and a program component 220. These components are used to program the programmable memory cell 202 and are inactive during the data read cycle.

The circuit 200 also includes leakage transistors 222 and 224. As shown in FIG. 2, the gate terminals of leakage transistors 222 and 224 are each connected to a high voltage Vdd. Thus, the leakage transistors 222 and 224 are enabled and connect the bit line 212 to ground. During a read cycle, the leakage transistors 222 and 224 are used to avoid spurious readings when the programmable memory cell 202 is unprogrammed. When the programmable memory cell 202 is unprogrammed, the bit line 212 is floating. In this configuration, the voltage on the bit line 212 could sometimes float to a value greater than $V_{ref}$, resulting in an incorrect reading. The leakage transistors 222 and 224 avoid this by connecting the bit line 212 to ground. Finally, the circuit 200 includes a discharge transistor 226, which is controlled by a discharge signal PC. The discharge transistor 226 is used to discharge the bit line 212 prior to the data read cycle.

Figure 3:
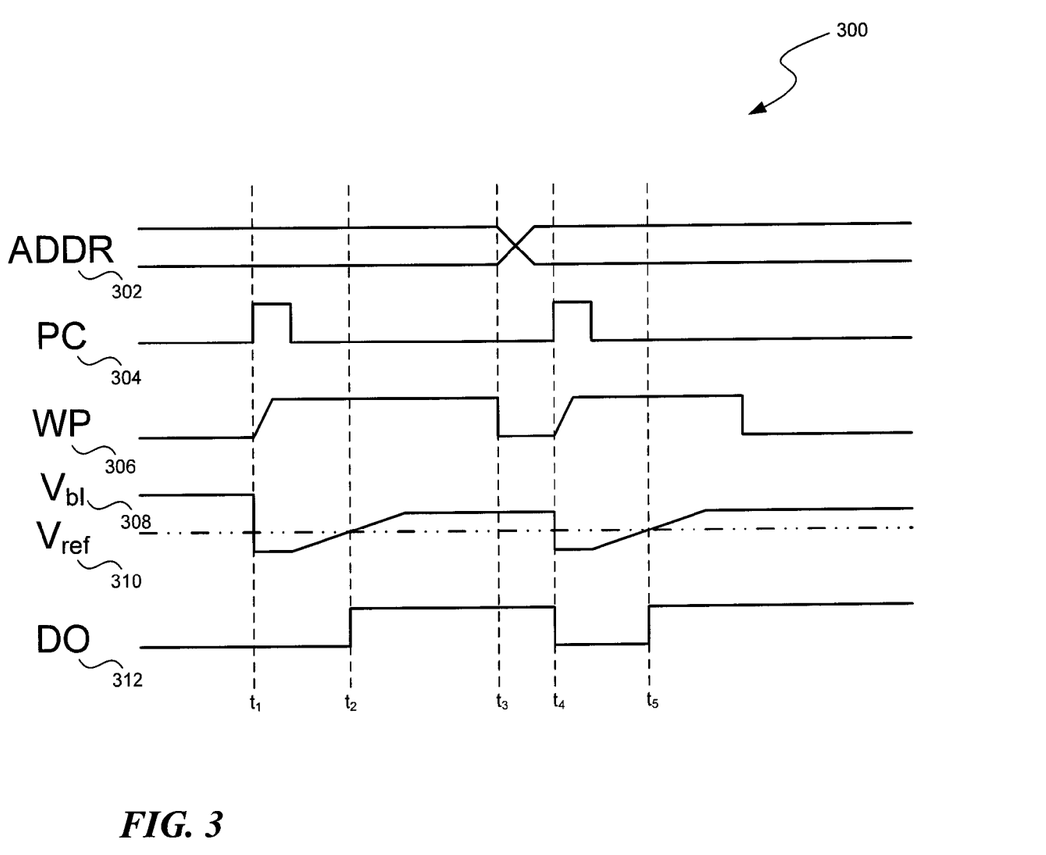
FIG. 3 illustrates a timing diagram of signals used to read data from the programmable memory cell.

FIG. 3 illustrates a timing diagram 300 of signals used to read data from the programmable memory cell 202. The operation of the circuit 200 will be described below with reference to FIGS. 2 and 3. Although not shown in the timing diagram 300, the write enable (WE) signal connected to the gate of the program select transistor 218 is connected to ground during the read process. This isolates the program component 220 from the circuit 200 during the read cycle, because the program component 220 is active only for programming the memory cell 202.

As shown in FIG. 3, a read cycle begins at time $t_1$. Prior to time $t_1$, the system latches the read address signal 302 into the address latch 104. At time $t_1$, the PC signal 304 is raised to a high value. As discussed above, this discharges any residual charge present on the bit line 212. As a result, the bit line voltage ($V_{bl}$) signal 308 drops from a high (or unspecified) value to a low value at time $t_1$ in response to the PC signal 304 being raised. The PC signal 304 is generally raised only long enough to remove any residual charge from the bit line 212.

Beginning at time $t_1$, the WP signal 306 is raised from a low value to a high value. The output signal differs depending on whether the programmable memory cell 202 has been programmed. In an unprogrammed state, the programmable memory cell 202 acts as an open circuit. Thus, if the programmable memory cell is unprogrammed, changing the value of the WP signal 306 has no effect on the output signals in the circuit 200.

However, if the programmable memory cell 202 has been programmed, raising the WP signal 306 to a high value causes current to flow from the WP signal line 210 through the programmable memory cell 202 and the address transistors 204 and 206. This raises the voltage on the bit line 212, as shown by the $V_{bl}$ signal 308 in FIG. 3. Between times $t_1$ and $t_2$, the $V_{bl}$ signal 308 is rising but below the reference voltage $V_{ref}$ 310, which is the reference value provided to the sense amplifier 114. Thus, between times $t_1$ and $t_2$, the sense amplifier 114 produces a zero value for the data output (DO) signal 312. However, at time $t_2$, the $V_{bl}$ signal 308 has increased to be equal to $V_{ref}$ 310. Thus, at time $t_2$, the DO signal 312 of the sense amplifier 114 changes from zero to one.

After the signal DO 312 has been held high for a sufficient period of time (i.e. sufficient time to read the data), the WP signal 306 is lowered again at time $t_3$. After time $t_3$, the address signal 302 is changed so that the circuit 200 may read data from a different memory address. The system then repeats the read cycle for the memory cell associated with the new memory address. Thus, after the new read address signal 302 has been provided between times $t_3$ and $t_4$, a new read cycle begins. As shown in timing diagram 300, the new read cycle begins at time $t_4$, when the system raises the PC signal 304 to a high value. This discharges the $V_{bl}$ signal 308, dropping the $V_{bl}$ signal 308 below $V_{ref}$ 310. The DO signal 312 then drops from one to zero. Also at time $t_4$, the system raises the WP signal 306 to a high value. If the new memory cell being read has been programmed, the $V_{bl}$ signal 308 again begins to rise until it crosses the threshold $V_{ref}$ 310 at time $t_5$. At time $t_5$, the DO signal 312 again changes from zero to one.

Figure 4:
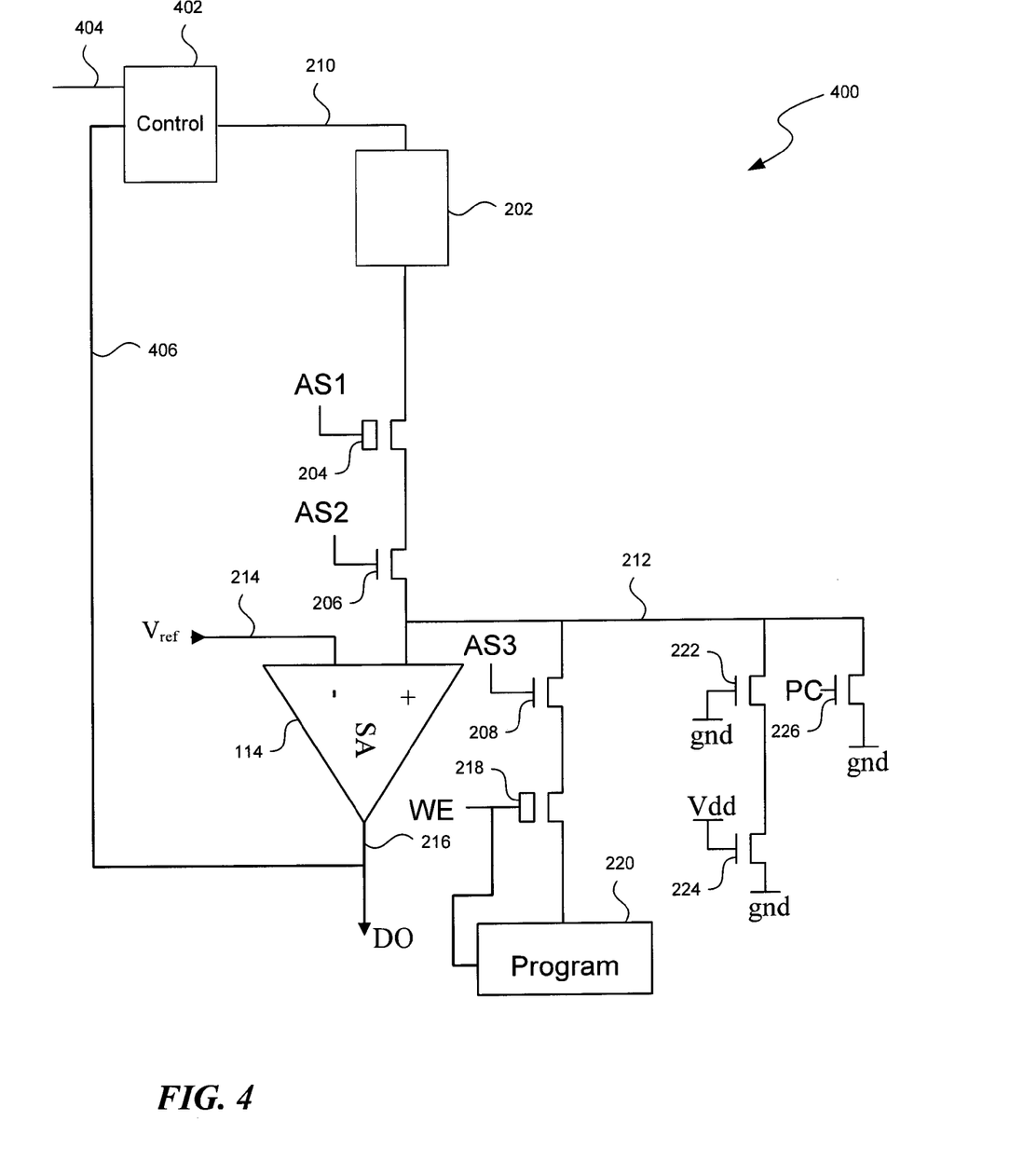
FIG. 4 illustrates a voltage-sensing circuit configured to use voltage sensing to shut off a memory programming process.

FIG. 4 illustrates a voltage-sensing circuit 400 configured to use voltage sensing to shut off a memory programming process. As shown in FIG. 4, the circuit 400 is substantially similar to the circuit 200 of FIG. 2. However, in the circuit 400, the signals are generated so that the programmable memory cell 202 is programmed to transition to store a one value. The specific method by which the programmable memory cell 202 is programmed depends on the underlying technology of the memory cell being programmed and may include additional programming signals not shown in the circuit 400. However, these differences are not germane to the present system.

In addition to the elements discussed above, circuit 400 includes a control component 402. The control component 402 receives a write signal through input line 404 and a feedback signal through feedback line 406. The control component 402 generates a write signal provided on the WP signal line 210. The behavior of control component 402 is described in detail below. In addition, the gate terminal of the leakage transistor 222 is connected to ground, disabling the transistor. Because the bit line 212 never floats during a write cycle, there is no need to connect the bit line 212 to ground.

Figure 5:
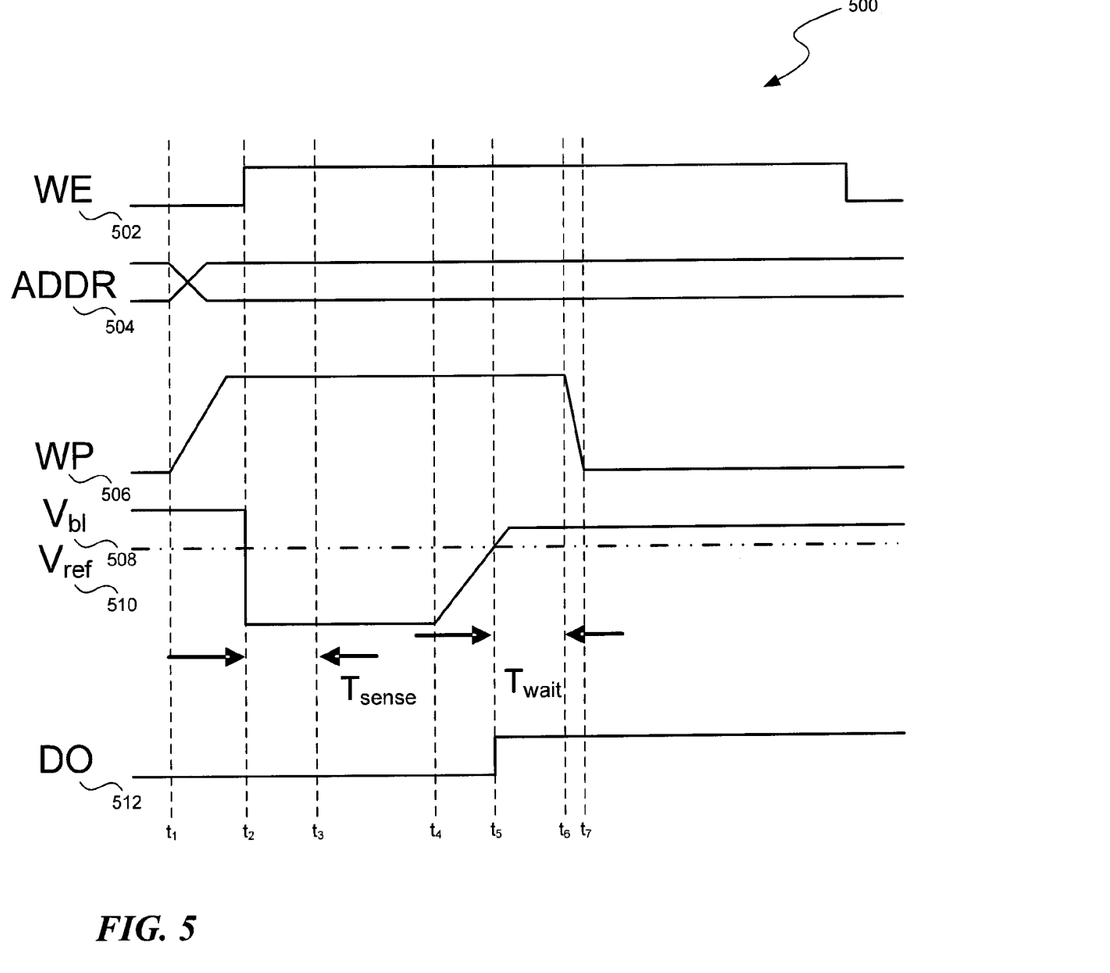
FIG. 5 illustrates a timing diagram of signals for programming the programmable memory cell using a voltage-sensing method to control auto shut-off.

FIG. 5 illustrates a timing diagram 500 showing signals for programming the programmable memory cell 202 using a voltage-sensing method to control auto shut-off. The functioning of the circuit 400 is described below with reference to FIGS. 4 and 5. The specific steps of the programming process depend on the underlying technology of the programmable memory cell 202. If the memory cell technology uses dielectric breakdown to store data, the programmable memory cell 202 may be programmed by providing a higher voltage on the WP signal line 210 than is provided during the read cycle. The programming process may also include providing a sink current through the program component 220. In this implementation, the program select transistor 218 is enabled, so that the sink current flows from the bit line 212 through the program component 220. Thus, in the timing diagram 500, the programming process begins at time $t_1$, when the system begins raising the WP signal 506 from a low value to a high value.

Between time $t_1$ and $t_2$, the system latches address signal 504. Although the address signal is shown being latched after the WP signal 506 begins to rise, the address may also be latched before the WP signal 506 changes. As shown in the timing diagram 500, the WP signal 506 reaches a high value before time $t_2$. At time $t_2$, the system raises the WE signal 502 from a low value to a high value. In the circuit 400, the WE signal 502 is connected to the gate of program select transistor 218 and the program component 220. In response to the WE signal 502, the program component 220 generates a sink current that flows through the program select transistor 218. As the sink current flows, the voltage on the bit line 212 (shown by $V_{bl}$ signal 508) drops from a high value to a low value. Thus, beginning at time $t_2$, the DO signal 512 is at a low value. Because the DO signal 512 is not measured or used before time $t_2$, the DO signal 512 may be either high or low during that time period.

As shown in FIG. 4, the DO signal 512 is also provided to the control component 402 through feedback line 406. The control component 402 controls the WP signal 506 based on the value of the DO signal 512 and other settings. The logic of the control component 402 may be implemented in a number of ways. For example, the control component 402 may be implemented using analog or digital logic, an Application-Specific Integrated Circuit (ASIC), or a programmable microcontroller. The control logic may be fixed in the hardware or may be implemented by software or firmware.

In one embodiment, the control component 402 is configured to wait a predetermined amount of time before beginning to sense the value on the feedback line 406. For example, in the timing diagram 500, the control component 402 is configured to wait a specified time period $T_{sense}$ before beginning to detect the value of the feedback signal. After the time period $T_{sense}$ has passed (at time $t_3$), the control component 402 begins sensing the value of the DO signal 512 to determine if the programmable memory cell 202 has been programmed. Alternatively the control component 402 may be configured to begin sensing the value of the feedback signal immediately.

As discussed previously, the programming signals must be applied to the programmable memory cell 202 for a minimum time before the programmable memory cell 202 is programmed. At time $t_4$, the programming signals have been applied to the programmable memory cell 202 for sufficient amount of time to enable the programmable memory cell 202 to begin behaving like a resistor, so current flows to the bit line 212. Thus, the $V_{bl}$ signal 508 begins to rise at time $t_4$ in response to this current. At time $t_5$, the $V_{bl}$ signal 508 is equal to $V_{ref}$ 510. When the $V_{bl}$ signal 508 equals or exceeds $V_{ref}$ 510, the DO signal 512 transitions from zero to one, changing the value of the feedback signal carried on feedback line 406.

The control component 402 shuts off the WP signal 506 in response to the feedback signal. In one embodiment, the control component 402 stops the WP signal 506 as soon as the feedback signal indicates that the cell has been programmed. However, the control component 402 may be configured to wait an additional amount of time to ensure that the programmable memory cell 202 is fully programmed. For example, the control component 402 may be configured with a second wait time period, denoted as $T_{wait}$, during which it continues programming the memory cell. After the time period $T_{wait}$ has passed (at time $t_6$), the control component 402 ends the programming process by dropping the WP signal 506 to the low value. This drop happens over the period between time $t_6$ and time $t_7$ in the timing diagram 500.

One skilled in the art will appreciate that the time periods $T_{sense}$ and $T_{wait}$ may be configured for various reasons and to have various values. For example, the thresholds may be set according to theoretical understandings of the internal physics of the programmable memory cell 202. The time periods may also be configured based on experimental determination of average times for programming to begin or to complete. In one embodiment, both time periods $T_{sense}$ and $T_{wait}$ are set to 200 nanoseconds.

Figure 6:
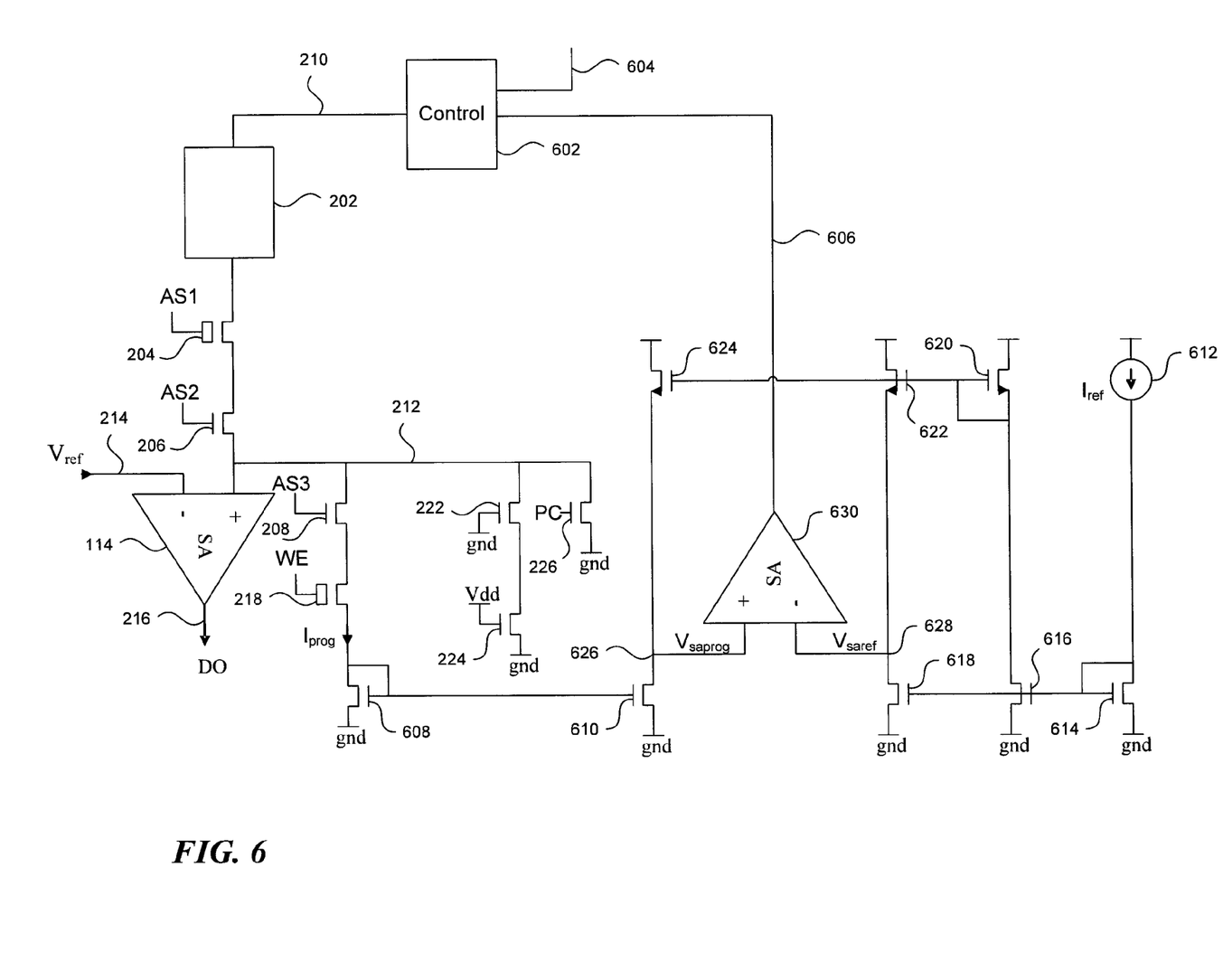
FIG. 6 illustrates a current-sensing circuit configured to use current sensing to shut off a memory programming process.

FIG. 6 illustrates a current-sensing circuit 600 configured to use current sensing to shut off a memory programming process. The configuration of the circuit 600 is similar to the configuration of read circuit 200 and voltage-sensing circuit 400. For example, circuit 600 includes a programmable memory cell 202 similar to those discussed above with reference to FIG. 2. Similar to the circuit 400 in FIG. 4, the circuit 600 also includes a control component 602, which is configured to generate the WP signal provided through signal line 210. The control component 602 generates the WP signal in response to a write signal received through input line 604 and a feedback signal received through feedback line 606. The generation of the feedback signal provided on line 606 is described in detail below.

The circuit 600 uses a reference current and an output current to determine when the programmable memory cell 202 has been successfully programmed. To that end, the circuit 600 includes a transistor 608 that has its drain connected to the source of the program selector transistor 218. The source of the transistor 608 is connected to ground and the drain and gate terminals are connected together. The gate terminal of the transistor 608 is also connected to the gate terminal of a transistor 610, making a current follower configuration. Thus, the current between the source and drain of transistor 610 is equal to the programming current $I_{prog}$ flowing between the source and drain of transistor 608, if the component transistors are equivalent. Transistor parameters may also be varied so that the current flowing through transistor 610 is proportional to the input current.

The circuit 600 also includes a current source 612, which generates a reference current $I_{ref}$. The reference current $I_{ref}$ is provided to transistor 614, which has its drain and gate terminals connected. The gate terminal of transistor 614 is also connected to the gate terminals of transistors 616 and 618, creating a second set of current followers. Thus, for each of the transistors 616 and 618, the current between the source and drain is equal to (or proportional to) the reference current $I_{ref}$ from the current source 612. The drain of transistor 616 is connected to the drain of a p-type transistor 620. The drain and gate terminals of transistor 620 are connected together and the gate terminal of transistor 620 is connected to the gate terminals of transistors 622 and 624, creating a third set of current mirrors.

This configuration of transistors produces a sensing voltage $V_{saprog}$ at point 626 that is proportional to the programming current $I_{prog}$. Similarly, this configuration generates a reference voltage $V_{saref}$ at point 628 that is proportional to the reference current $I_{ref}$. The voltages $V_{saprog}$ and $V_{saref}$ are provided to a second sense amplifier 630, which compares the signal voltage $V_{saprog}$ to the reference voltage $V_{saref}$. One skilled in the art will appreciate that this configuration is equivalent to comparing the programming current $I_{prog}$ to the reference current $I_{ref}$. Thus, the output signal from the sense amplifier 630 is zero if the input signal $V_{saprog}$ (or $I_{prog}$) is less than the reference signal $V_{saref}$ (or $I_{ref}$) and becomes one when the programming current $I_{prog}$ becomes greater than $I_{ref}$. The output signal from sense amplifier 630 is connected to the control component 602 through feedback line 606.

Figure 7:
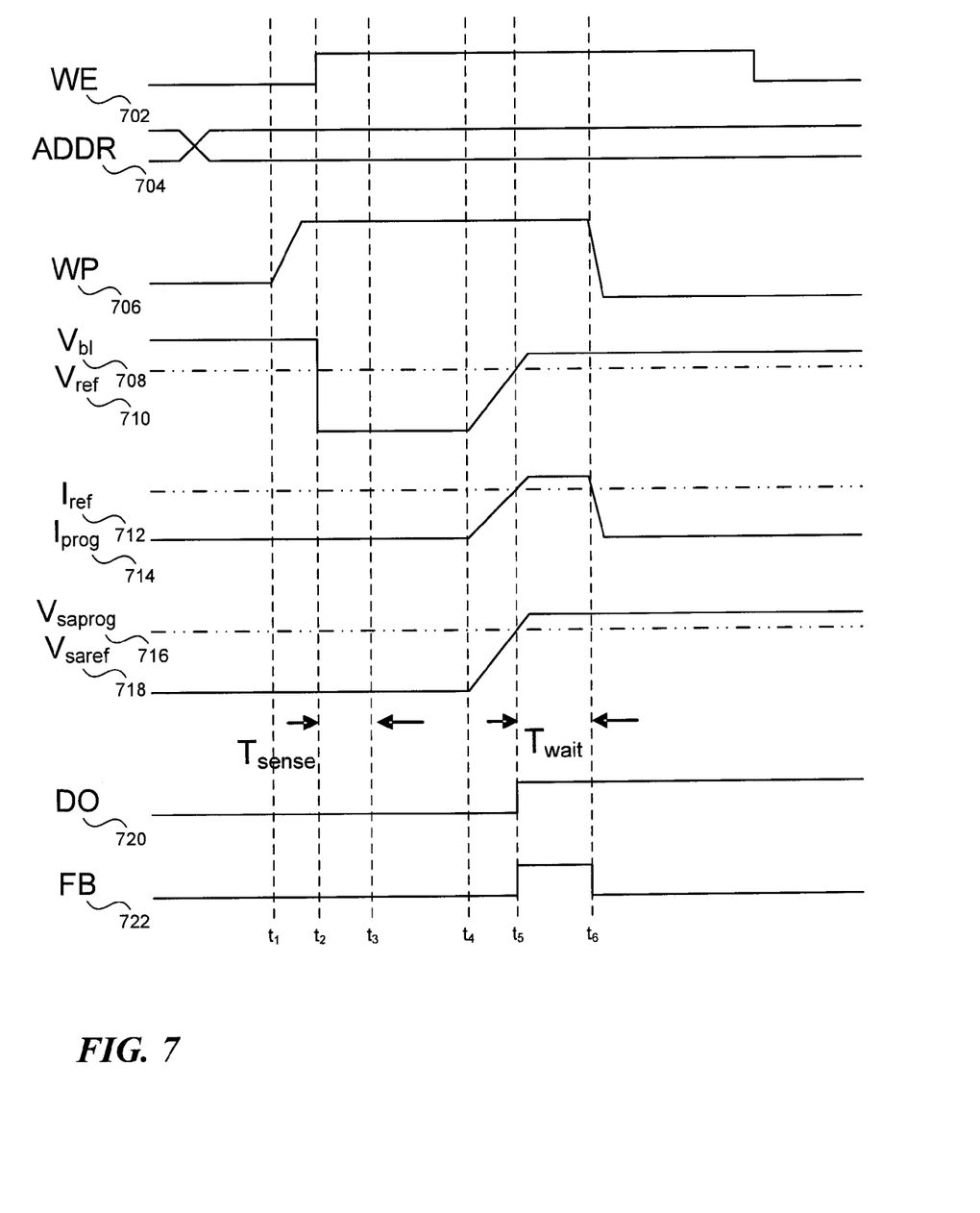
FIG. 7 illustrates a timing diagram of signals for programming a programmable memory cell using a current-sensing method to control auto shut-off.

FIG. 7 illustrates a timing diagram 700 showing signals for programming a programmable memory cell using a current-sensing method to control auto shut-off. The functioning of the circuit 600 is described below with reference to FIGS. 6 and 7. As shown in timing diagram 700, the address signal 704 is latched before time ti. However, the address signal 704 could be latched at any time before the write process begins, including between time $t_1$ and time $t_2$. At time $t_1$, the control component 602 raises the WP signal 706 to a high voltage that is suitable for programming the programmable memory cell 202. At time $t_1$, the $V_{bl}$ signal 708 (i.e., the voltage of the bit line 212) may have any value, but the programming current $I_{prog}$ is low because the program select transistor 218 is not activated.

The WP signal 706 reaches its high value by time $t_2$. Also at time $t_2$, the WE signal 702 is raised. In response to the change in the WE signal 702, the program select transistor 218 is enabled, allowing the programming current $I_{prog}$ to flow from the bit line 212 through the program select transistor 218. The $V_{bl}$ signal 708 drops to a low value as the programming current $I_{prog}$ discharges the residual charge on the bit line 212.

As with the voltage-sensing circuit 400, the control component 602 in the current-sensing circuit 600 may be configured to wait a predetermined amount of time before beginning to sense the value of the feedback (FB) signal 722. For example, in the timing diagram 700, the control component 602 is configured to wait a specified time period $T_{sense}$ before beginning to sense the value of the FB signal 722 on feedback line 606. After the time period $T_{sense}$ has passed (at time $t_3$), the control component 602 begins sensing the value of the FB signal 722 to determine if the programmable memory cell has been programmed.

At time $t_4$, the programming signals have been applied to the programmable memory cell for a sufficient amount of time to enable the programmable memory cell to begin behaving as a resistor, so that current flows to the bit line 212. In response, the $V_{bl}$ signal 708 begins to rise. The increase in the $V_{bl}$ signal 708 causes an increase in the programming current $I_{prog}$ 714 through the program select transistor 218. The change in the current $I_{prog}$ 714 then causes the sensing voltage 716 (received by the sense amplifier 630 at connection 626) to increase. Thus, the $V_{bl}$ signal 708, the current $I_{prog}$ 714, and the sensing voltage 716 change in tandem. The sense amplifier 630 outputs the FB signal 722 based on the comparison of the current $I_{prog}$ 714 and the reference current $I_{ref}$ 712.

Before time $t_5$, the FB signal 722 is low because the programming current 714 is less than the reference current $I_{ref}$ 712. At time $t_5$, when the programming current 714 becomes equal to the reference current $I_{ref}$ 712, the FB signal 722 changes from zero to one. The control component 602 then shuts off the WP signal 706 in response to the change in the FB signal 722. As with the voltage-sensing circuit 400, the current-sensing circuit 600 may be configured to wait a second predetermined period of time $T_{wait}$ before stopping the WP signal 706. Thus, after the time period $T_{wait}$ has passed (at time $t_6$), the control component 602 ends the programming process by dropping the WP signal 706 to the low value. At that time, the programming current $I_{prog}$ 714 also falls to zero.

As shown in the timing diagram 700, the $V_{bl}$ signal 708 also becomes equal to $V_{ref}$ 710 at time $t_5$. Thus, at time $t_5$, the DO signal 720 changes from zero to one. However, this is not always the case. In some embodiments, the reference current $I_{ref}$ 712 produces a threshold that is different from $V_{ref}$ 710 provided to sense amplifier 114. In this configuration, the DO signal 720 transitions from zero to one at a time different from the transition in the FB signal 722.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A circuit for controlling auto shut-off of a programming process, the circuit comprising:
   a programmable memory cell configured to generate an output signal based on a control signal, wherein the output signal has a first value when the programmable memory cell is in a first state and a second value when the programmable memory cell is in a second state and wherein the programmable memory cell can be changed from the first state to the second state in response to a write signal;
   a comparison circuit configured to operate during a write operation to compare the output signal to a specified threshold value and generate a feedback signal based on the comparison; and
   a control circuit configured to provide the write signal continuously during the write operation and to wait for an additional set time period after receiving the feedback signal from the comparison circuit that indicates the memory cell has been programmed during which the control circuit continues to provide the write signal before shutting off the write signal.

2. The circuit of claim 1, further comprising:
   an address circuit configured to store a memory address corresponding to the programmable memory cell and to generate an address select signal based on the stored memory address; and
   a cell select circuit configured to selectively pass the output signal in response to the address select signal.

3. The circuit of claim 1, further comprising:
   a second comparison circuit configured to compare the output signal to a second threshold value and generate an output data signal based on the comparison.

4. The circuit of claim 1, wherein the output signal is a current and further comprising:
   a current source configured to generate a reference current; wherein the reference current is provided to the comparison circuit as the specified threshold value.

5. The circuit of claim 1, wherein the comparison circuit is further configured to generate a data output signal based on the comparison.

6. The circuit of claim 1, wherein the output signal and the specified threshold value are current signals.

7. The circuit of claim 1, wherein the control circuit is configured to wait a specified time after beginning to generate the write signal before changing the write signal based on the feedback signal.

8. The circuit of claim 1, wherein the programmable memory cell comprises a dielectric layer and changing the programmable memory cell from the first state to the second state comprises stressing the dielectric layer into breakdown.

9. The circuit of claim 1, wherein the control circuit is a programmable microcontroller.

10. A method of operating a circuit to control auto shut-off of a programming process of a programmable memory cell, the method comprising:
   continuously providing a write signal to a programmable memory cell during a write operation, the programmable memory cell having a first state and a second state, wherein the programmable memory cell can be changed between the first state and the second state in response to the write signal;
   generating an output signal from the programmable memory cell based on the write signal;
   comparing the output signal to a threshold value during the write operation;
   waiting for a set time period while continuing to provide the write signal to the programmable memory cell after a comparison of the output signal to the threshold value indicates that the memory cell has been programmed; and
   shutting off the write signal based on the comparison of the output signal to the specified threshold value after the set time period.

11. The method of claim 10, further comprising:
   providing an address select signal based on a memory address corresponding to the programmable memory cell; and
   selectively passing the output signal in response to the address select signal.

12. The method of claim 10, further comprising:
   comparing the output signal to a second threshold value; and
   generating an output data signal based on the comparison.

13. The method of claim 10, wherein the output signal is a current and further comprising:
   generating a reference current; and
   providing the reference current as the threshold value.

14. The method of claim 10, wherein the output signal and the specified threshold value are voltage signals.

15. The method of claim 10, wherein shutting off the write signal comprises waiting a specified time after beginning to generate the write signal before changing the write signal based on the comparison.

16. An apparatus for controlling auto shut-off of a programming process, the circuit comprising:
   a memory means for storing digital data;
   a comparison means for comparing an output signal from the memory means to a threshold value during a write operation; and
   a control means for programming the memory means to change the digital data from a first value to a second value, wherein the control means is configured to continuously provide a programming signal during a write operation and to wait for a set period of time after a comparison of the output signal to the threshold value indicates that the digital data in the memory means has changed from the first value to the second value during which the programming signal continues to be provided before shutting off the programming signal.

17. The apparatus of claim 16, further comprising:

a second comparison means for comparing the output signal to a second threshold value; and a means for generating an output data signal based on the comparison.

18. The apparatus of claim 16, wherein the output signal is a current and further comprising:

a means for generating a reference current; and a means for providing the reference current as the specified threshold value.

19. The apparatus of claim 16, wherein the output signal and the specified threshold value are current signals.

20. The apparatus of claim 16, wherein the control means waits a specified time after beginning to program the memory means before changing the programming signal based on the comparison.

\* \* \* \* \*

UNITED STATES PATENT AND TRADEMARK OFFICE
CERTIFICATE OF CORRECTION

PATENT NO. : 8,116,145 B2  
APPLICATION NO. : 12/202048  
DATED : February 14, 2012  
INVENTOR(S) : Pearl P. Cheng et al.

Page 1 of 1

It is certified that error appears in the above-identified patent and that said Letters Patent is hereby corrected as shown below:

In column 1, line 63, delete "($V_{TH(high)}$)" and insert -- ($V_{TH(high)}$) --, therefor.

In column 8, line 21, delete "ti." and insert -- $t_1$. --, therefor.

Signed and Sealed this
Fifteenth Day of May, 2012

David J. Kappos
*Director of the United States Patent and Trademark Office*